United States Patent
Park

(10) Patent No.: US 6,949,818 B2
(45) Date of Patent: Sep. 27, 2005

(54) SEMICONDUCTOR PACKAGE AND STRUCTURE THEREOF

(75) Inventor: Jin Ho Park, Seoul (KR)

(73) Assignee: Dongbu Electronics Co., Inc., Seoul (KR)

( * ) Notice: Subject to any disclaimer, the term of this patent is extended or adjusted under 35 U.S.C. 154(b) by 0 days.

(21) Appl. No.: 10/751,183

(22) Filed: Dec. 30, 2003

(65) Prior Publication Data

US 2004/0227220 A1 Nov. 18, 2004

(30) Foreign Application Priority Data

Dec. 30, 2002 (KR) .................................. 10-2002-0086246
Dec. 30, 2002 (KR) .................................. 10-2002-0086245

(51) Int. Cl.7 .............................................. H01L 23/02
(52) U.S. Cl. ...................... 257/686; 257/692; 257/777; 438/109
(58) Field of Search ................................ 257/678, 685, 257/686, 692, 693, 696, 723, 777; 438/106, 109

(56) References Cited

U.S. PATENT DOCUMENTS

| | | | | |
|---|---|---|---|---|
| 5,498,902 A | * | 3/1996 | Hara | 257/686 |
| 5,706,172 A | * | 1/1998 | Lee | 361/735 |
| 5,834,836 A | * | 11/1998 | Park et al. | 257/686 |
| 6,040,621 A | * | 3/2000 | Nose | 257/666 |
| 6,080,931 A | * | 6/2000 | Park et al. | 174/52.4 |
| 6,522,020 B2 | * | 2/2003 | Hong | 257/782 |

* cited by examiner

Primary Examiner—T. N. Quach
(74) Attorney, Agent, or Firm—Andrew D. Fortney

(57) ABSTRACT

A semiconductor package includes a semiconductor chip connected to lead frames by wires and outer leads protruding from the semiconductor package. At this time, the outer leads are connected to the lead frames and grooves into which the outer leads are inserted into are provided in the semiconductor package, wherein the grooves are connected the lead frames. In mounting a first and a second semiconductor package, the outer leads of the first semiconductor package are inserted into the grooves of the second semiconductor package.

9 Claims, 6 Drawing Sheets

(BACKGROUND)

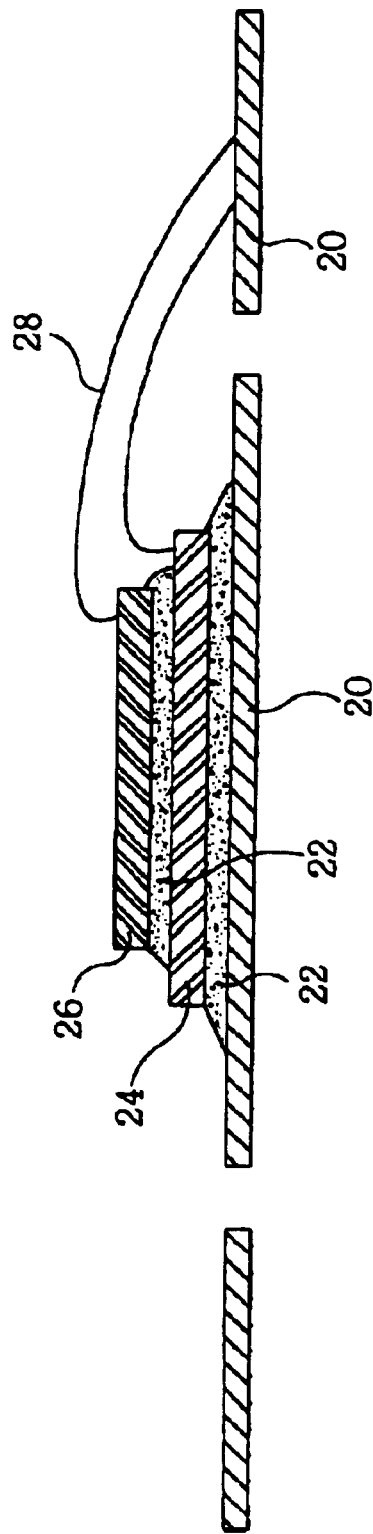

SEMICONDUCTOR PACKAGE AND STRUCTURE THEREOF

FIELD OF THE INVENTION

The present invention relates to a semiconductor package; and, more particularly, to a semiconductor package having a stacked type structure, wherein the semiconductor package is capable of being easily reworked even though any one chip mounted thereon has defects.

BACKGROUND OF THE INVENTION

Most of electric systems, e.g., a computer, a PCS, a cellur phone and a PDA, using semiconductor chips become highly integrated, miniaturized and lightweight for satisfying demands of users. As a design technique and a manufacturing process technique are developed, the semiconductor chips used in the electric systems become also highly integrated, miniaturized and lightweight. According to such trends, a semiconductor package becomes also miniaturized and lightweight, and various techniques for mounting at least two or more semiconductor chips on one PCB have widely been proposed.

Referring to FIG. 1, there is illustrated a first embodiment of a conventional semiconductor package. As shown in FIG. 1, in the conventional semiconductor package, a first chip 12, a second chip 14 and a third chip 16 are mounted on a PCB 10. Because such a semiconductor package must have a large area for mounting semiconductor chips thereon, it has a limitation to mount many semiconductor chips on the PCB.

In order to solve the above problem, there have been proposed various processes for stacking many semiconductor chips in one package.

Referring to FIG. 2, there is shown a second embodiment of a conventional semiconductor package. As shown in FIG. 2, a first chip 24 and a second chip 26 are stacked on a PCB 20. At this time, a resin for fixing the first chip 24 to the PCB 20 or the first chip 24 to the second chip 26 is provided in the semiconductor package and each of leads (not shown) of the first and second chips 24, 26 is connected with an exterior lead frame (not shown) of the PCB 20 by wires 28, thereby forming the semiconductor package.

The semiconductor package of a stacked type described above has a merit of decreasing an occupying area of the PCB; however, in case one chip has defects, it is impossible to exchange the chip with new one, such that the semiconductor package having a defective semiconductor chip cannot be used anymore.

SUMMARY OF THE INVENTION

It is, therefore, an object of the present invention to provide a semiconductor package capable of being reworked although one chip has defects by stacking semiconductor package in a stacked type.

In accordance with a preferred embodiment of the present invention, there is provided a semiconductor package including:

a semiconductor chip electrically connected to lead frames;

outer leads protruding from a surface of the semiconductor package, wherein the outer leads are connected to the semiconductor chip through via holes, metal lines and the lead frames connected to the metal lines; and grooves formed at a surface of the semiconductor package, the grooves being connected the metal lines.

In accordance with another preferred embodiment of the present invention, there is provided a semiconductor package including:

a semiconductor chip electrically connected to lead frames; and outer wires protruding from a surface of the semiconductor package, wherein the outer wires are connected to the semiconductor chip through via holes, metal lines and the lead frames connected to the metal lines.

BRIEF DESCRIPTION OF THE DRAWINGS

The above and other objects and features of the present invention will become apparent from the following description of preferred embodiments given in conjunction with the accompanying drawings, in which:

FIG. 2 provides a front view of a second embodiment of the conventional semiconductor package;

DETAILED DESCRIPTION OF PREFERRED EMBODIMENTS

Figure 1:
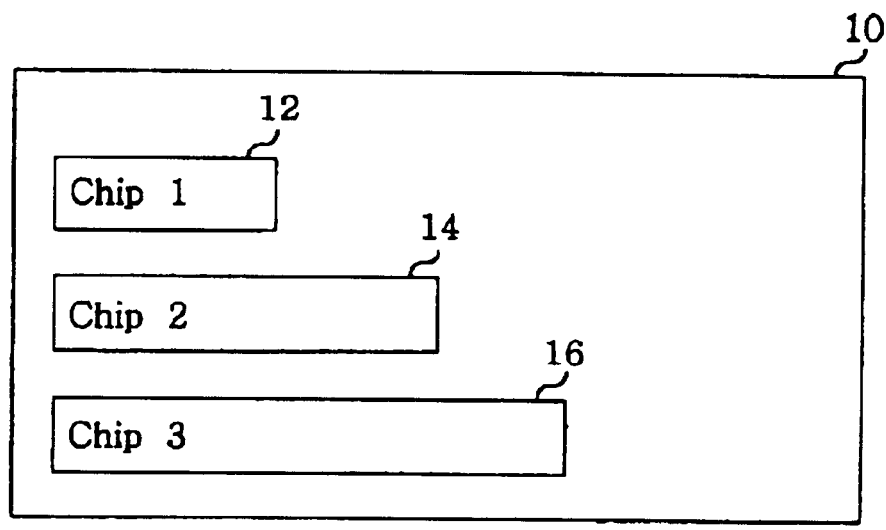
FIG. 1 illustrates a top view of a first embodiment of a conventional semiconductor package.

A preferred embodiment of the present invention will now be described in detail with reference to the accompanying drawings, wherein like reference numerals appearing in the drawings represent like parts.

A first preferred embodiment of the present invention will now be described with reference to FIGS. 3A to 4B.

Figure 3A:
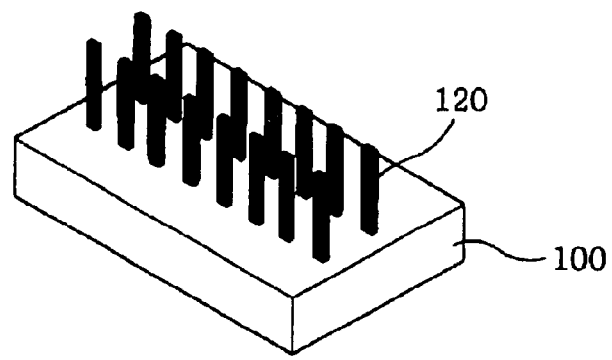
FIGS. 3A to 3B set forth a perspective view and a cross sectional view of a semiconductor package of a first preferred embodiment of the present invention.
Figure 3B:
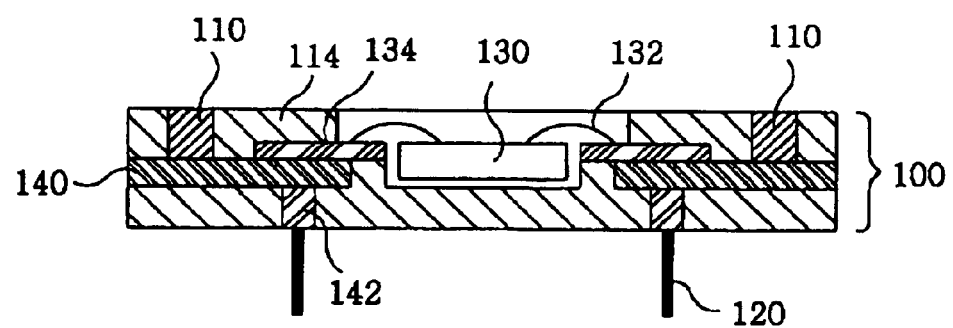

Referring to FIGS. 3A to 3B, a semiconductor chip 130 is located in a semiconductor package 100 and the semiconductor chip 130 is connected to lead frames 134 by wires 132. Metal lines 140 are connected to an upper or a lower portion of the lead frames 134 and an inner space except for the semiconductor chip 130 and the wires 132 region of the semiconductor package is molded with an adhesive material, e.g., a resin 114. Also, grooves 110 into which outer leads 120 are inserted are formed in a lower portion of the metal lines 140 and connected to the lead frames 134 through the metal lines 140. The outer leads 120 protruding from via holes 142 penetrating the molded layer are formed on an upper portion of the metal lines 140 through the via holes 142 and, therefore, connected to the lead frames 134 through the metal lines 140.

Accordingly, in case the outer leads 120 are formed on an upper portion of the semiconductor package in order to stack at least more than two semiconductor packages in a stacked type, the grooves 110 into which the outer leads 120 will be inserted must be formed on an opposite lower portion of the semiconductor package.

Figure 4A:
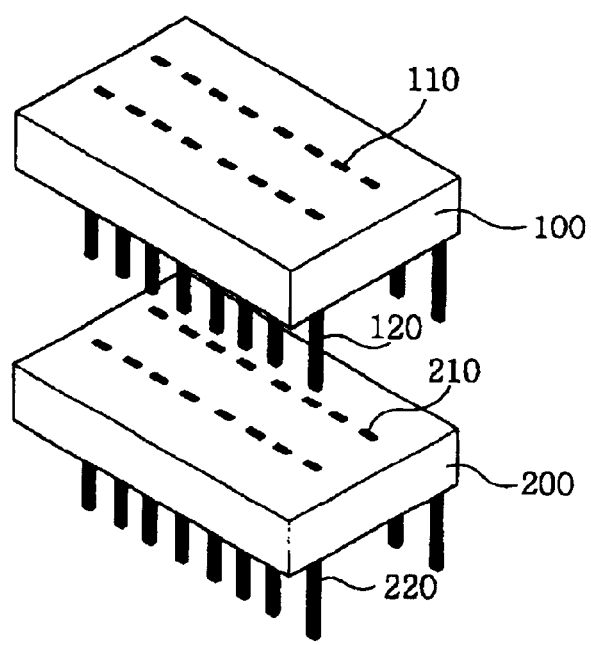
FIGS. 4A to 4B depict perspective views of the semiconductor packages mounted in a stacked type of the first preferred embodiment of the present invention.
Figure 4B:
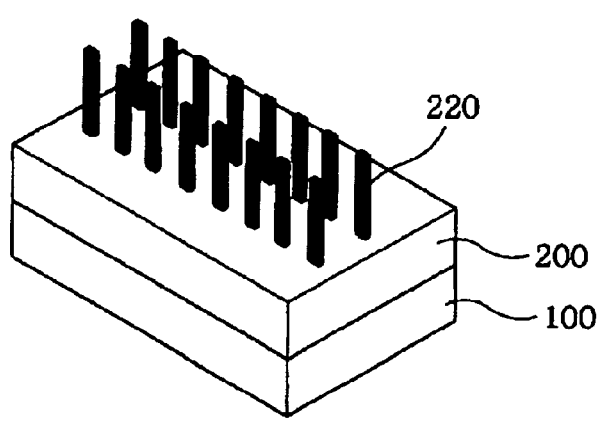

FIGS. 4A to 4B show a process of mounting the semiconductor packages in the stacked type.

A first and a second semiconductor package 100, 200 having the outer leads 120, 220 and the grooves 110, 210 on the upper portion and the lower portion, respectively, are provided. The outer leads 120 formed on the upper portion of the first semiconductor package 100 are inserted into the grooves 210 formed on the lower portion of the second semiconductor package 200.

Then, as shown in FIG. 4B, the first semiconductor package 100 and the second semiconductor package 200 are integrally stacked such that the area occupied by the semiconductor packages may be minimized in mounting the semiconductor packages on the PCB.

A second preferred embodiment of the present invention will now be described with reference to FIGS. 5A to 6B.

Figure 5A:
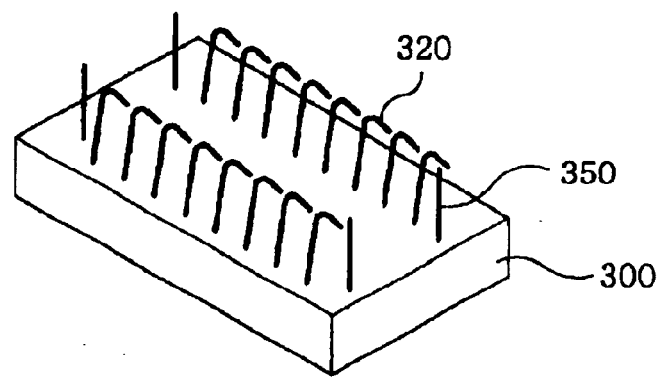
FIGS. 5A to 5B provide a perspective view and a cross sectional view of a semiconductor package of a second preferred embodiment of the present invention.
Figure 5B:
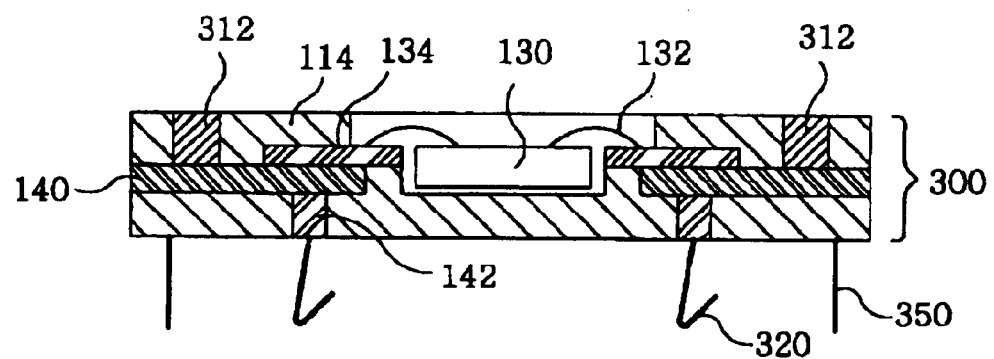

Referring to FIGS. 5A to 5B, the semiconductor chip 130 is located in a semiconductor package 300 and the semiconductor chip 130 is connected to the lead frames 134 by the wires 132. The metal lines 140 are connected to the upper portion or the lower portion of the lead frames 134 and an inner space except for the semiconductor chip 130 and the wires 132 region of the semiconductor package 300 is molded with the resin 114. Also, an outer wires 320 protruding from the via holes 142 penetrating the molded layer are formed on the upper portion of the metal lines 140 through the via holes 142 and, therefore, connected to the lead frames 134 through the metal lines 140. Though not shown in drawing, another outer wires may be additionally installed on the lower portion of the semiconductor package 300. In this case, another via holes 312 into which another outer wires (not shown) will be inserted may be formed on the lower portion of the metal lines 140 and perpendicularly connected to the metal lines 140.

The outer wires 320 of the semiconductor package 300 of the present invention have a latch-shaped end, so that the outer wires 320 of at least more than two semiconductor packages may be intercrossed, thereby forming the semiconductor package having a stacked type structure.

Accordingly, in case the outer wires 320 are formed on the upper or the lower portion of the semiconductor package 300 in order to stack at least more than two semiconductor packages in the stacked type, supporting structures 350 having a predetermined height are preferably formed on the surface on which the outer wires 320 of the semiconductor package 300 are disposed. The third semiconductor package 300 can be connected to a fourth semiconductor package having positioning holes by inserting its supporting structures into the positioning holes, as will be described.

Figure 6A:
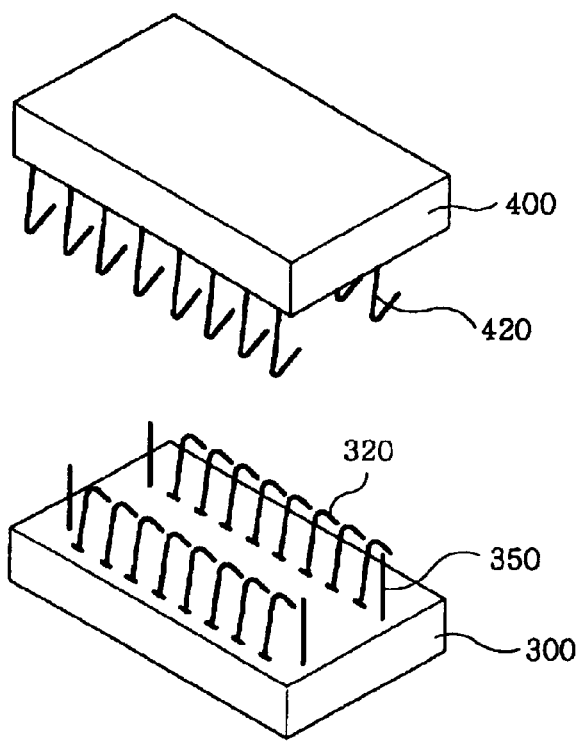
FIGS. 6A to 6B offer perspective views of the semiconductor packages mounted in a stacked type of the second preferred embodiment of the present invention.
Figure 6B:
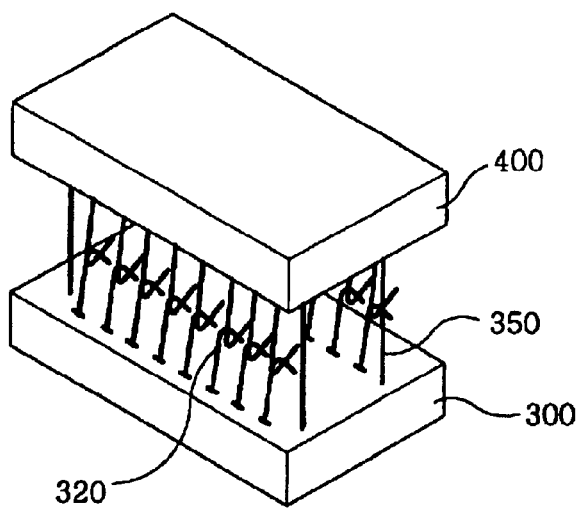

FIGS. 6A to 6B provide a process of mounting the semiconductor packages in the stacked type.

A third and a fourth semiconductor package 300, 400 having the outer wires 320, 420 of a latch-shaped end on the upper portion or the lower portion, respectively are provided.

The outer wires 320 formed on the upper portion of the third semiconductor package 300 are connected to the outer wires 420 formed on the upper portion of the fourth semiconductor package 400 by interconnecting the latch-shaped ends of the outer wires 320, 420. At this time, though not shown in drawings, the semiconductor chip of the third semiconductor package 300 is contacted with the semiconductor chip of the fourth semiconductor package 400 by connecting the outer wires 320 of the third semiconductor package 300 to the outer wires 420 of the fourth semiconductor package 400.

Then, as shown in FIG. 6B, the third semiconductor package 300 and the fourth semiconductor package 400 are integrally stacked such that the area occupied by the semiconductor packages 300, 400 may be minimized in mounting the semiconductor packages 300, 400 on the PCB.

In addition, such semiconductor packages 300, 400 having the stacked type structure are safely fixed to each other by inserting the supporting structures 350 having the predetermined length into positioning holes (not shown). At this time, because the supporting structures 350 determine the perpendicular length between the third semiconductor package 300 and the fourth semiconductor package 400, wherein the third semiconductor package is connected to the fourth semiconductor package by interconnecting the outer wires 320, 420, it is preferable that the supporting structures 350 have a length greater than the total length of the interconnected outer wires 320, 420.

In this second embodiment, although two semiconductor packages are described, it is appreciated that the above arrangements may be employed to more than three semiconductor packages in accordance with users demands.

While the invention has been shown and described with respect to the preferred embodiment, it will be understood by those skilled in the art that various changes and modifications may be made without departing from the spirit and scope of the invention as defined in the following claims.

What is claimed is:

1. A semiconductor package comprising:
   a semiconductor chip electrically connected to lead frames;
   outer leads protruding from a surface of the semiconductor package through via holes formed thereat, wherein the outer leads are connected to metal lines and the metal lines are connected to the lead frames; and
   grooves formed at a surface of the semiconductor package to expose the metal lines, whereby outer leads of another semiconductor package are connected to the metal lines through the grooves.

2. The semiconductor package of claim 1, wherein the outer leads are disposed opposite to the grooves.

3. The semiconductor package of claim 1, wherein the semiconductor package is connected to another semiconductor package by inserting the outer leads of the semiconductor package into grooves of another semiconductor package.

4. A semiconductor package comprising:
   a semiconductor chip electrically connected to lead frames; and
   outer wires protruding from a surface of the semiconductor package, wherein the outer wires are connected to the semiconductor chip through via holes, metal lines and the lead frames connected to the metal lines,
   wherein the semiconductor package is connected to another semiconductor package by interconnecting the outer wires with outer wires of another semiconductor package.

5. The semiconductor package of claim 4, further comprising supporting structures having a predetermined length, the supporting structures being provided on the surface from which the outer wires protrude.

6. The semiconductor package of claim 5, wherein positioning holes are provided on another semiconductor package.

7. The semiconductor package of claim 6, wherein the semiconductor package is connected to another semiconductor package by inserting the supporting structures of the semiconductor package into the positioning holes of another semiconductor package.

8. The semiconductor package of claim 7, wherein the supporting structures have a length greater than a total length of the interconnected outer wires.

9. The semiconductor package of claim 6, wherein the supporting structures are inserted into the positioning holes.

* * * * *